United States Patent
Nam et al.

(10) Patent No.: US 7,135,422 B2
(45) Date of Patent: Nov. 14, 2006

(54) METHODS OF FORMING A MULTI-LAYERED STRUCTURE USING AN ATOMIC LAYER DEPOSITION PROCESS AND METHODS OF FORMING A CAPACITOR OF AN INTEGRATED CIRCUIT DEVICE

(75) Inventors: Gab-Jin Nam, Gyeonggi-do (KR); Jong-Wan Kwon, Gyeonggi-do (KR); Han-Mei Choi, Seoul (KR); Jae-Soon Lim, Seoul (KR); Seung-Hwan Lee, Seoul (KR); Ki-Chul Kim, Gyeonggi-do (KR); Sung-Tae Kim, Seoul (KR); Young-Sun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 10/884,507

(22) Filed: Jul. 2, 2004

(65) Prior Publication Data
US 2005/0009369 A1    Jan. 13, 2005

(30) Foreign Application Priority Data
Jul. 8, 2003    (KR)    ............... 10-2003-0046173

(51) Int. Cl.
*H01L 21/31* (2006.01)

(52) U.S. Cl. ............... 438/785; 438/240; 438/758; 438/786

(58) Field of Classification Search ............... 438/240, 438/758, 785, 786
See application file for complete search history.

(56) References Cited

U.S. PATENT DOCUMENTS

| 6,420,279 B1 | 7/2002 | Ono et al. | |
| 2003/0040153 A1* | 2/2003 | Kim et al. | 438/240 |
| 2003/0234417 A1* | 12/2003 | Raajimakers et al. | 257/309 |
| 2004/0171280 A1* | 9/2004 | Conley et al. | 438/785 |

FOREIGN PATENT DOCUMENTS

| KR | 000013654 A | 3/2000 |
| KR | 2001-0097641 A | 11/2001 |

* cited by examiner

*Primary Examiner*—Mary Wilczewski
*Assistant Examiner*—Bac H. Au
(74) *Attorney, Agent, or Firm*—Myers Bigel Sibley & Sajovec, PA

(57) ABSTRACT

Multi-layered structures formed using atomic-layer deposition processes include multiple metal oxide layers wherein the metal oxide layers are formed without the presence of interlayer oxide layers and may include different metal oxide compositions.

23 Claims, 10 Drawing Sheets

METHODS OF FORMING A MULTI-LAYERED STRUCTURE USING AN ATOMIC LAYER DEPOSITION PROCESS AND METHODS OF FORMING A CAPACITOR OF AN INTEGRATED CIRCUIT DEVICE

CROSS-REFERENCE TO RELATED APPLICATION

This application claims priority under 35 U.S.C. § 119 to Korean Patent Application No. 2003-46173, filed on Jul. 8, 2003, which is incorporated herein by reference in its entirety.

FIELD OF THE INVENTION

This invention relates to multi-layered structures and methods of forming multi-layered structures.

BACKGROUND OF THE INVENTION

As information processing apparatuses are developed, integrated circuit devices have been improved to operate with reduced response speeds. One method that may improve the response speed of an integrated circuit device is to increase the integration of cells on a single chip.

The need for increased speed and reduction in size has led to extensive research of capacitors. Generally, capacitors of an integrated circuit device include a bottom electrode, a dielectric layer formed on the bottom electrode, and a top electrode formed on the dielectric layer. Deposition processes are usually performed to form capacitors.

FIGS. 1A–1B illustrate cross-sectional views of a capacitor formed according to deposition processes known in the art. In FIG. 1A, a bottom electrode 102 is formed on a substrate 100 having a contact region. In FIG. 1B illustrates a dielectric layer 106 formed on the bottom electrode 102. The dielectric layer is oxidized by the introduction of ozone. In addition to oxidizing the dielectric layer, the ozone forms an interface oxide film 104 between the bottom electrode 102 and the dielectric layer 106. The interface oxide film 104 can result because of the high oxidation power of the ozone. The presence of the interface oxide film can reduce the dielectric constant of the dielectric layer 106 and is therefore undesirable.

The formation of capacitors as illustrated in FIGS. 1A–1B is also generally carried out in multiple deposition apparatuses. For example, dielectric layers 106 having several layers or films may be formed. Each film or layer may be formed in a separate deposition apparatus depending upon the deposition conditions required. Thus, the processing times required to form the dielectric layers 106 are longer than if the process was carried out in a single deposition apparatus.

Therefore, it is desirable to develop methods for forming structures lacking an interface oxide film between an electrode and a dielectric layer. In addition, it is desirable to develop methods for forming such structures in a single deposition apparatus.

SUMMARY OF THE INVENTION

Embodiments of the present invention can include multi-layered structures formed in a single atomic-layer deposition chamber. The temperature of the deposition chamber may be predetermined such that all of the processes required to form the multi-layered structures may be carried out in the deposition chamber. The formation of metal oxide layers in the multi-layered structures may be performed with water vapor or an oxidizing agent having a low oxidation power to inhibit the formation of unwanted oxide layers.

According to some embodiments of the present invention, a method for forming a multi-layered structure using an atomic layer deposition process includes the formation of a first metal oxide film over a substrate followed by the formation of a second metal oxide film over the first metal oxide film. The first metal oxide film is formed from oxidation of a first metal absorption film using water vapor or an oxidizing agent having a low oxidation power with respect to the substrate. The formation of the metal oxide film using water vapor inhibits the formation of an interlayer oxide layer between the metal oxide film and a substrate on which the metal oxide film is formed. A second metal oxide film can be formed over the first metal oxide film by the ozone oxidation of a second metal absorption film.

According to other embodiments of the present invention, multi-layered structures include multiple layers formed from the metal oxide films. Methods for forming the multi-layered structures having multiple metal layers include the formation of multiple metal layers wherein each metal layer includes one or more first metal oxide films and one or more second metal oxide films. The first metal oxide films can be formed by oxidizing a first metal absorption layer with water vapor. The second metal oxide films can be formed by oxidizing second metal absorption films with ozone. The use of water vapor as an oxidizing agent can inhibit the formation of interlayer oxides. Each metal layer can be formed to a desired thickness by depositing multiple first metal oxide films and second metal oxide films.

According to other embodiments of the present invention, a capacitor can be formed having a multi-layered dielectric layer. The multi-layered dielectric layer can include one or more first metal oxide films and one or more second metal oxide films. The metal oxide films can be formed according to embodiments of the present invention using water vapor as an oxidizing agent and ozone as a second oxidizing agent. The multi-layered dielectric layers can be void of interlayer oxide films due to the use of water vapor as the oxidizing agent.

BRIEF DESCRIPTION OF THE DRAWING FIGURES

The invention can be more readily ascertained from the following description of the invention when read in conjunction with the accompanying drawings in which.

DETAILED DESCRIPTION OF THE INVENTION

Figure 1A:
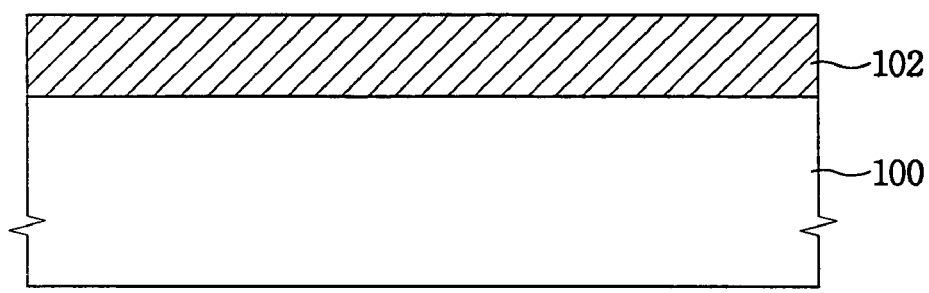
FIGS. 1A–1B are cross-sectional views illustrating the formation of dielectric layers in a capacitor according to methods known in the prior art.
Figure 1B:
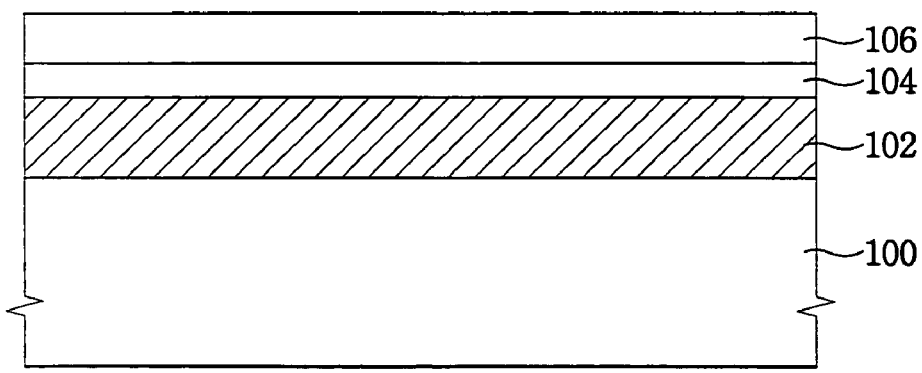

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. When an element such as a layer, region or substrate is referred to as being "directly on" another element, it is in direct contact with that other element.

Embodiments of the present invention include methods for forming multi-layered structures and multi-layered structures formed by these methods. In some embodiments, the multi-layered structures are formed using atomic layer deposition processes. In other embodiments, the multi-layered structures are formed in a closed system or a single chamber. The thickness of the layers of the multi-layered structures formed according to embodiments of the present invention can be adjusted as desired for a particular application by varying deposition conditions in the atomic layer deposition process.

Embodiments of the present invention can also include methods for forming a multi-layered structure includes the deposition of multiple layers using an atomic layer deposition process. Two or more layers of metal oxides can be formed on a substrate using an atomic layer deposition process wherein a first metal layer is deposited on the substrate and oxidized to form a first metal oxide layer, followed by the deposition of a second metal layer on the first metal oxide layer and oxidation of the second metal layer to form a second metal oxide layer. Additional metal oxide layers can be formed on the second metal oxide layer using the same processes as used to deposit the first and second metal oxide layers.

The formation of multiple metal oxide layers on a substrate can be performed in an atomic layer deposition chamber. In some embodiments, the formation of the multiple metal oxide layers can be performed in a single atomic layer deposition chamber to improve the efficiency of the process. In addition, the temperature and pressure of the atomic layer deposition chamber can be adjusted to allow different metal oxide layers to be deposited on a substrate at different or varying temperatures and pressures as desired.

According to some embodiments of the present invention, a method for forming a multi-layered structure using an atomic layer deposition process can include the formation of a first metal oxide film over a substrate followed by the formation of a second metal oxide film over the first metal oxide film. The first metal oxide film can be deposited on a substrate in an atomic layer deposition chamber by the formation of a first absorption film on the substrate followed by the oxidization of the first absorption film to form the first metal oxide film. The second metal oxide film can be deposited on the first metal oxide film by the formation of a second absorption film over the first metal oxide film followed by the oxidation of the second absorption film.

The first absorption film can be deposited on a substrate loaded into an atomic layer deposition chamber by the introduction of a first metal precursor into the deposition chamber using an inert gas as a carrier gas. Portions of the first metal precursor introduced into the deposition chamber settle on a surface of the substrate. Those portions of the first metal precursor that do not form the first absorption film on the substrate are purged from the deposition chamber so that the first absorption film is formed on the substrate. An inert gas may be used as a purge gas.

In some embodiments, a first oxidizing agent can be introduced into the deposition chamber to oxidize the first absorption film on the substrate surface. The introduction of the oxidizing agent can occur after an unused portion of the first metal precursor is removed from the deposition chamber. The first oxidizing agent reacts with the first metal precursor to form a first metal oxide film. Any first oxidizing agent that does not react with the first absorption film to produce the first metal oxide film is purged from the deposition chamber.

A second absorption film can be deposited on the first metal oxide film by the introduction of a second metal precursor into the deposition chamber following a purge of the first oxidizing agent. Portions of the second metal precursor introduced into the deposition chamber are formed on a surface of the first metal oxide film, forming a second absorption film on the first metal oxide film. The second absorption film is formed on the first metal oxide film by chemisorption, physisorption, or a combination of chemisorption and physisorption. Those portions of the second metal precursor that do not form the second absorption film on the first metal oxide film are purged from the deposition chamber.

A second oxidizing agent can be introduced into the deposition chamber to oxidize the second absorption film. The introduction of the second oxidizing agent can occur after an unused portion of the second metal precursor is removed from the deposition chamber. The second oxidizing agent reacts with the second metal precursor to form a second metal oxide film on the first metal oxide film. Those portions of the second oxidizing agent that do not react with the second absorption film to produce the second metal oxide film are purged from the deposition chamber.

The temperature of the deposition chamber can be set at a pre-determined temperature prior to the introduction of the first metal precursor into the deposition chamber. According to embodiments of the present invention, the temperature within the deposition chamber can be between about 100° C. to about 700° C. In other embodiments, the temperature of the deposition chamber can be maintained at between about 250° C. and about 450° C. during the deposition and oxidation of the first and second metal oxide layers. The use of a predetermined temperature in the deposition chamber for each step in the processes of the present invention allows the formation of multi-layered structures using a single chamber even though several kinds of reactants can be used in the formation of the multi-layered structure.

The first and second metal precursors include metal precursors that can be used in the formation of semiconductor and microelectronic devices. For example, the metal precursors can include, but are not limited to, tantalum (Ta) compounds, hafnium (Hf) compounds, titanium (Ti) compounds, aluminum (Al) compounds, and lanthanum (La) compounds. A combination of metal precursors can be selected to form the layers of a multi-layered structure based upon the desired characteristics of the structure. For example, aluminum oxide films may generate low leakage currents and have relatively low dielectric constants. Hafnium oxide films and titanium oxide films may exhibit a relatively high dielectric constant as well as a relatively high leakage current. By creating different layers of films the characteristics of the multi-layered structure can be altered. Therefore, multi-layered structures having hafnium-aluminum oxide films or titanium-aluminum oxide films may exhibit low leakage current and high dielectric constants.

The first oxidizing agents used with embodiments of the present invention can include oxidizing agents having a low oxidation power relative to the substrate such as water vapor and the second oxidizing agents used with embodiments of the present invention can include oxidizing agents having a high oxidation power relative to the first oxidizing agents such as ozone. The use of water vapor as an oxidizing agent to oxidize a metal absorption film on a substrate helps to prevent the formation of an oxide layer between the formed metal oxide layer and the substrate.

Figure 2A:
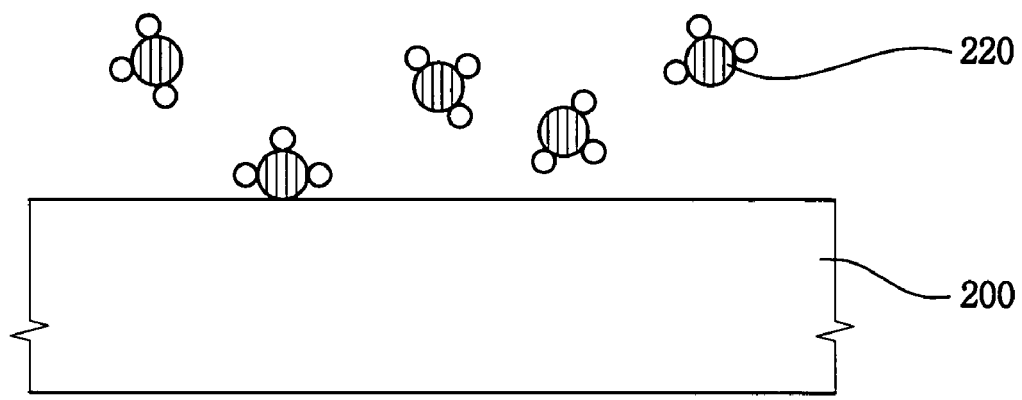
FIGS. 2A–2D are cross-sectional views of a multi-layered structure formed according to embodiments of the present invention.
Figure 2B:
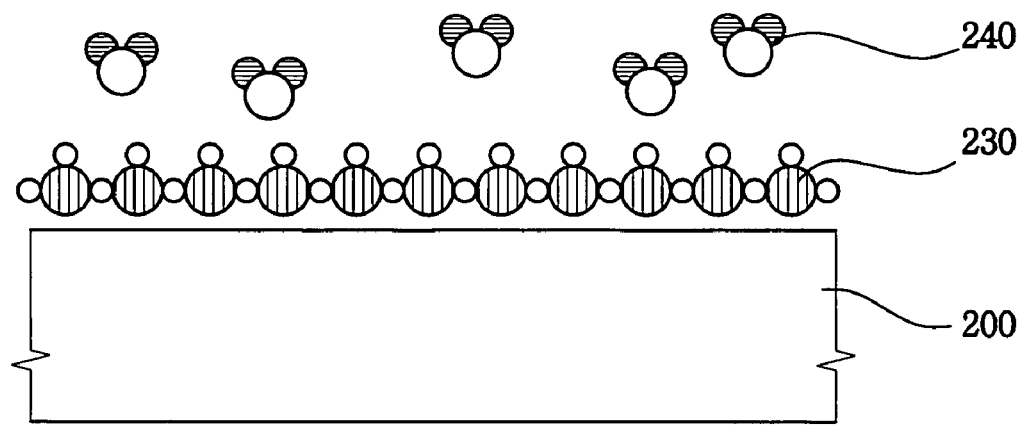
Figure 2C:
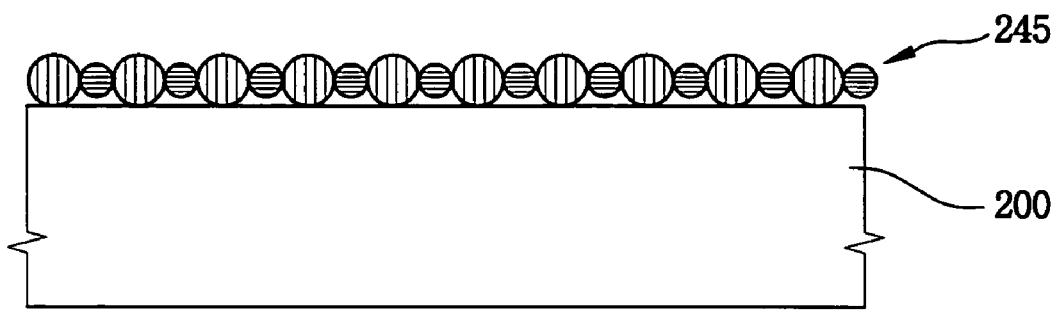
Figure 2D:
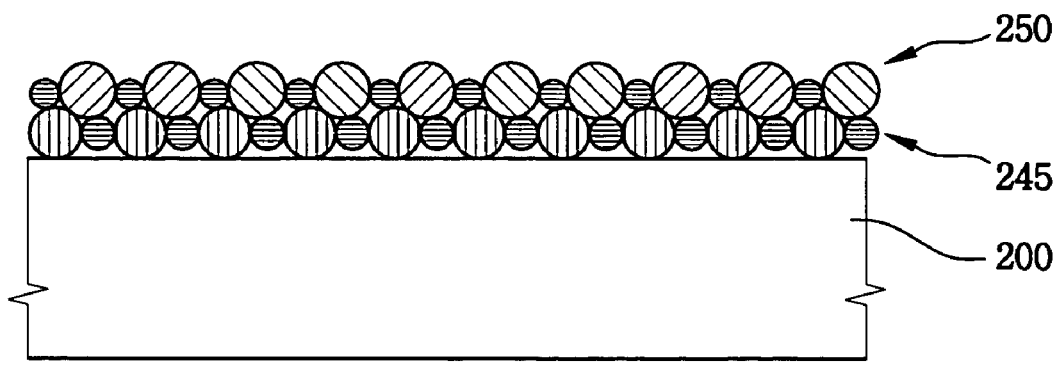

A cross-sectional view of a multi-layered structure formed according to embodiments of the present invention is illustrated in FIG. 2D. Exemplary process steps for forming the illustrated multi-layered structure are shown in FIGS. 2A–2D.

As illustrated in FIG. 2A, a substrate 200 is loaded into an atomic-layer deposition chamber (not shown) set at a predetermined temperature between about 100° C. and about 700° C. A first metal precursor 220 is introduced into the deposition chamber. For example, trimethylaluminum (TMA) is introduced as the first metal precursor 220.

FIG. 2B illustrates a first absorption film 230 formed from the trimethylaluminum first metal precursor 220 that settles on a surface of the substrate 200. The first absorption film 230 results from the chemisorption of trimethylaluminum 220 on the substrate 200. As illustrated in FIG. 2B, the physisorbed trimethylaluminum 220 and other unused trimethylaluminum 220 is purged from the deposition chamber leaving only the first absorption film 230.

FIG. 2B also illustrates the introduction of a first oxidation agent 240 into the deposition chamber. For example, water vapor may be introduced into the deposition chamber as the first oxidizing agent 240 to oxidize the first absorption layer 230.

As illustrated in FIG. 2C, the first absorption film 230 is oxidized by the water vapor first oxidizing agent 240 to form the first metal oxide film 245. For example, the water vapor 240 oxidizes the trimethylaluminum 220 to form a first metal oxide film 245 of aluminum oxide. First oxidizing agent 240 not consumed in the oxidation of the first absorption layer 230 is purged from the deposition chamber.

A second metal oxide film 250 is formed over the first metal oxide film 245 as illustrated in FIG. 2D. The formation of the second metal oxide film 250 according to embodiments of the present invention is achieved by introducing a second metal precursor into the deposition chamber with a substrate 200 having a first metal oxide film 245. The second metal precursor is chemisorbed and physisorbed onto portions of a surface of the first metal oxide film 245. For example, a hafnium compound or a titanium compound could be introduced to the deposition chamber as the second metal precursor. Portions of the second metal precursor are chemisorbed onto portions of the first metal oxide film 245 and form a second absorption film thereon. Those portions of the second metal precursor that do not form the second absorption film are purged from the deposition chamber. Following purging, a second oxidizing agent is introduced into the deposition chamber. The second oxidizing agent oxidizes the second absorption film, forming the second metal oxide film 250. Second oxidizing agent that does not react with the second absorption film is purged from the deposition chamber, leaving a multi-layered structure as illustrated in FIG. 2D. oxide first metal oxide film 245 formed according to the steps illustrated in FIGS. 2A–2C and previously described. A hafnium chloride ($HfCl_4$) com-position is introduced into the deposition chamber as a second metal precursor. Other hafnium compounds, including but not limited to tetrakis(ethylmethylamino) hafnium (TEMAH) or hafnium tetrabutoxide could also be used as the second metal precursor. Similarly, titanium compounds such as titanium tetrachloride ($TiCl_4$) or titanium tetra isopropoxide (TTIP) could also be used in place of hafnium chloride as the second metal precursor. The hafnium chloride is physisorbed and chemisorbed on the first metal oxide film 245. The chemisorbed hafnium chloride forms a second absorption film on the first metal oxide film 245. Those portions of the hafnium chloride that do not form the second absorption film are purged from the deposition chamber. A second oxidation agent, for example ozone, is then introduced into the deposition chamber. The ozone oxidizes the hafnium chloride second absorption layer to form the second metal oxide film 250. Ozone that does not participate in the oxidation reaction is purged from the deposition chamber, leaving the multi-layered structure illustrated in FIG. 2D.

Multiple thin layers may be formed on a substrate by repeating the process steps described with respect to FIGS. 2A–2D.

As illustrated in FIGS. 2A–2D, the use of water as an oxidizing agent with embodiments of the present invention prevents the formation of an oxide film between the substrate 200 and the first metal oxide film 245. The water vapor prevents the formation of an interlayer oxide film because the oxidation power of the water vapor is relatively low compared to the substrate.

Reactive components that are removed from the deposition chamber according to processes of the present invention may be removed by known methods, for instance, by purging the deposition chamber with an inert gas. Reactive components that may be removed this way include, for example, metal precursors and oxidizing agents.

In other embodiments of the present invention multi-layered structures include multiple layers of the metal oxide films. Methods for forming the multi-layered structures having multiple metal layers include the formation of multiple metal layers wherein each metal layer includes one or more first metal oxide films and one or more second metal oxide films. Each metal layer is formed to a desired thickness by depositing multiple first metal oxide films and second metal oxide films.

An example of the formation of a multi-layered structure having metal layers according to some embodiments of the present invention is illustrated in FIGS. 3A–3F.

Figure 3A:
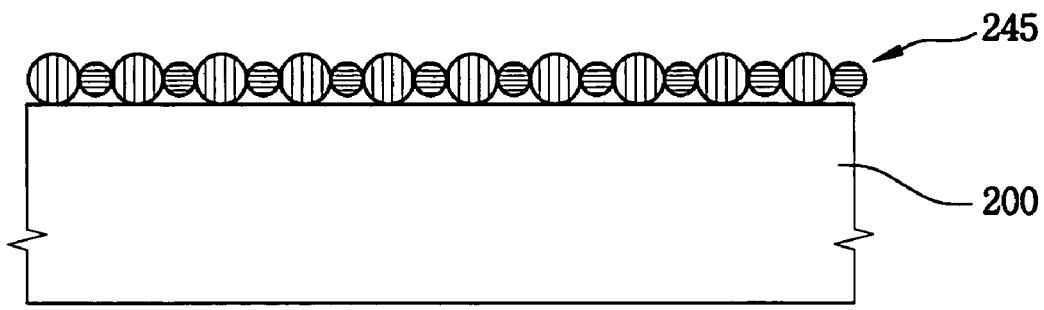
FIGS. 3A–3F are cross-sectional views of a multi-layered structure formed according to embodiments of the present invention.

Referring to FIG. 3A, a first metal oxide film is deposited on a substrate in an atomic-layer deposition chamber. The first metal oxide film is formed by loading a substrate 200 into a deposition chamber (not shown) at a predetermined temperature, for example, between about 100° C. and about 700° C. A first metal precursor is introduced into the deposition chamber and a first absorption film is formed on the substrate. Portions of the first metal precursor that do not form the first absorption film are purged from the reactor. A first oxidizing agent is then introduced into the deposition chamber to oxidize the first absorption film and form the first metal oxide film 245 illustrated in FIG. 3A. Unused portions of the first oxidizing agent are purged from the deposition chamber.

The first metal oxide film 245 can include, for example, an aluminum oxide film formed by the oxidation of a trimethylaluminum absorption layer using water vapor. A trimethylaluminum absorption film is deposited using trimethylaluminum as the first metal precursor. The use of water vapor as a first oxidizing agent oxidizes the trimethylaluminum and prevents the formation of an oxide layer between the first metal oxide film 245 and the substrate 200.

Figure 3B:
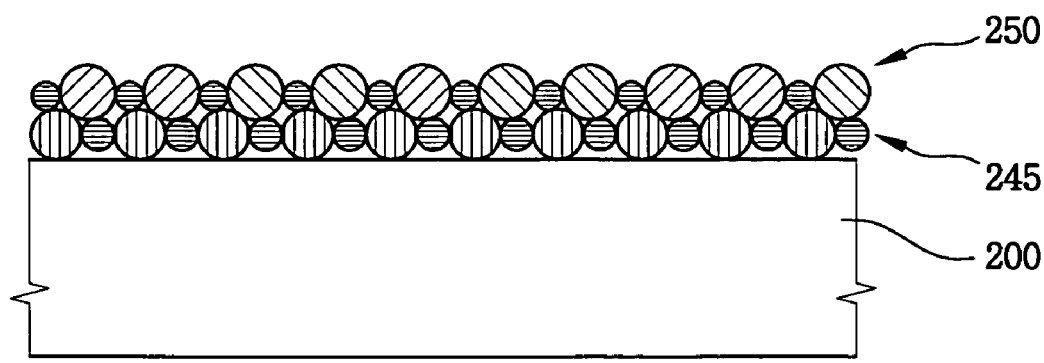

A second metal oxide film 250 is then formed over the first metal oxide film 245 as illustrated in FIG. 3B. The second metal oxide film 250 is formed by the introduction of a second metal precursor into the deposition chamber. The second metal precursor forms a second absorption film on the first metal oxide film. Portions of the second metal precursor that do not form the second absorption film are purged from the deposition chamber. A second oxidizing agent is introduced to the deposition chamber to rapidly oxidize the second absorption film and form the second metal oxide film 250. Unused portions of the second oxidizing agent are purged from the deposition chamber.

For example, a hafnium chloride metal precursor may be introduced into the deposition chamber to form a hafnium chloride second absorption layer over the first metal oxide film. Ozone introduced as the second oxidizing agent rapidly oxidizes the hafnium chloride absorption layer, forming the second metal oxide film 250.

Figure 3C:
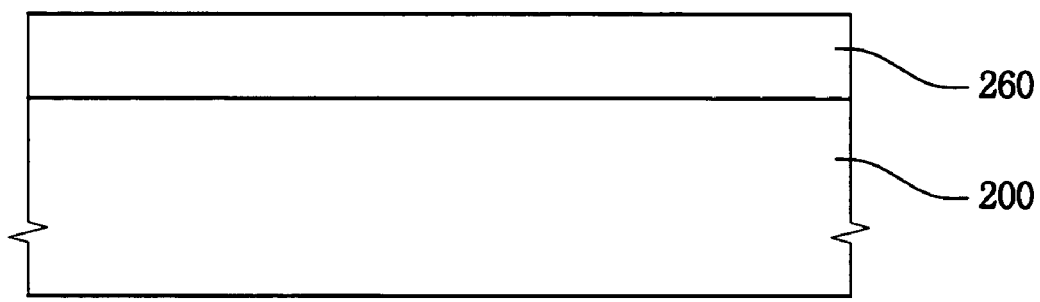

According to some embodiments of the present invention, the combination of the first metal oxide film and the second metal oxide film form a first metal layer 260 as illustrated in FIG. 3C. In other embodiments of the present invention, multiple first metal oxide films and second metal oxide films are consecutively deposited on one another to form a first metal layer 260. A first metal layer 260 having a desired thickness can be formed by repeatedly performing the steps illustrated in FIGS. 3A and 3B. The thickness of the metal layer 260 is therefore dependent upon the number of first metal oxide films 245 and second metal oxide films 250 used to form the metal layer 260.

Figure 3D:
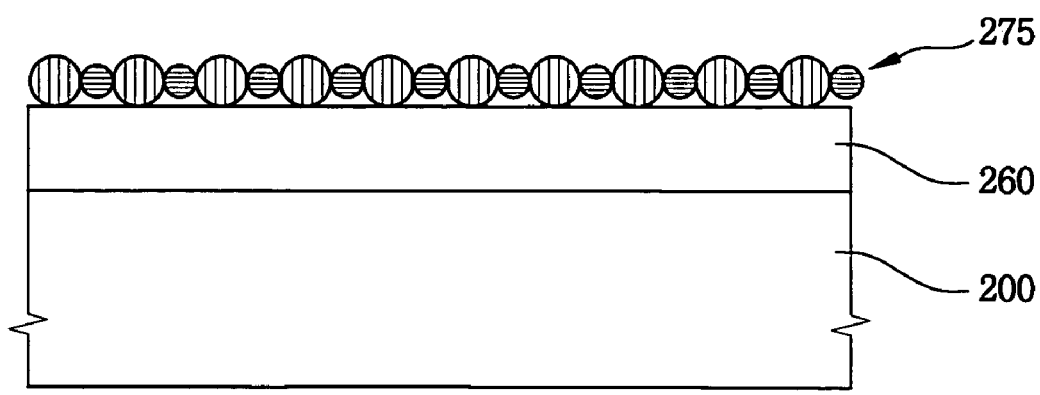
Figure 3E:
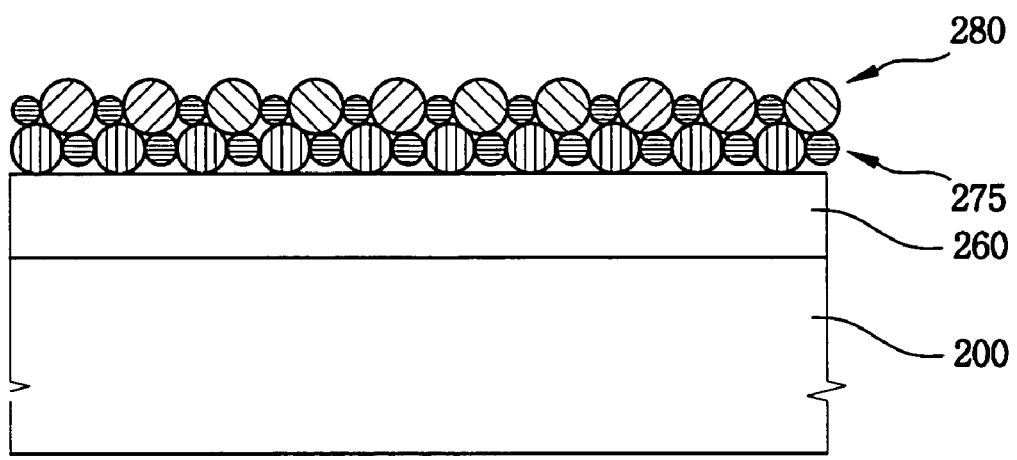
Figure 3F:
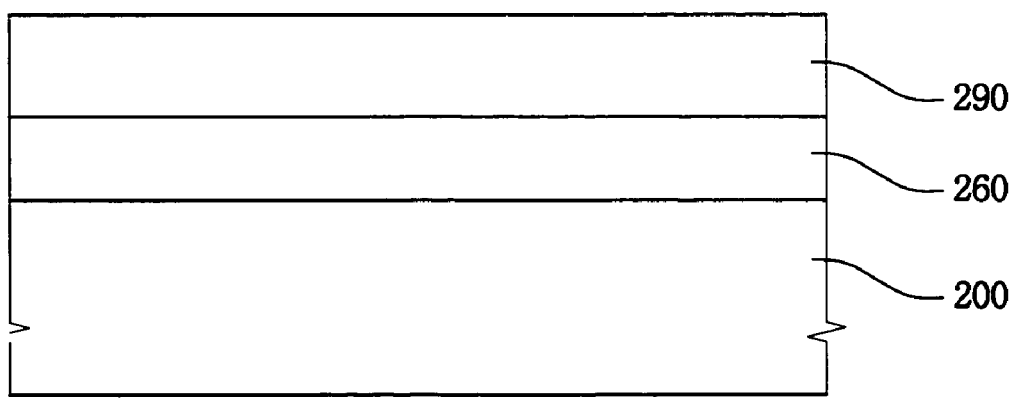

In other embodiments of the present invention, a second metal layer 290 is formed on the first metal layer 260 as illustrated in FIGS. 3D–3F.

FIG. 3D illustrates the formation of a third metal oxide film 275 on the first metal layer 260. The third metal oxide film 275 is formed by introducing a third metal precursor into the deposition chamber to form a third absorption film on the first metal layer 260. Unused portions of the third metal precursor are purged from the deposition chamber and an oxidizing agent is introduced to the deposition chamber. The oxidizing agent oxidizes the third absorption film to form the third metal oxide film 275 on the first metal layer 260.

For example, trimethylaluminum can be used as the third metal precursor to form a trimethylaluminum absorption layer on the first metal layer 260. Water vapor introduced as an oxidizing agent oxidizes the trimethylaluminum, forming an aluminum oxide third metal oxide film 275. The third metal oxide film 275 is formed with the formation of an oxide layer between the third metal oxide film 275 and the first metal layer 260.

A fourth metal oxide film 280 is then formed over the third metal oxide film 275 as illustrated in FIG. 3E. The fourth metal oxide film 280 is formed by the introduction of a fourth metal precursor into the deposition chamber. The fourth metal precursor forms a fourth absorption film on the third metal oxide film. Portions of the fourth metal precursor that do not form the fourth absorption film are purged from the deposition chamber. An oxidizing agent is introduced to the deposition chamber to rapidly oxidize the fourth absorption film and form the fourth metal oxide film 280. Unused portions of the oxidizing agent are purged from the deposition chamber.

For example, a hafnium chloride metal precursor may be introduced into the deposition chamber to form a hafnium chloride fourth absorption layer over the third metal oxide film 275. Ozone introduced as the oxidizing agent rapidly oxidizes the hafnium chloride absorption layer, forming the fourth metal oxide film 280.

According to embodiments of the present invention, the combination of the third metal oxide film 275 and the fourth metal oxide film 280 form a second metal layer 290 as illustrated in FIG. 3F. In other embodiments of the present invention, multiple third metal oxide films and fourth metal oxide films are consecutively deposited on one another to form a second metal layer 290. A second metal layer 290 having a desired thickness can be formed by repeatedly performing the steps illustrated in FIGS. 3D and 3E. The thickness of the second metal layer 290 is therefore dependent upon the number of third metal oxide films 275 and fourth metal oxide films 280 used to form the second metal layer 290.

Additional metal layers may be formed on the second metal layer 290 as desired by consecutively repeating the processes illustrated in FIGS. 3A–3B.

The use of water vapor as an oxidizing agent to form the first metal oxide films and third metal oxide films according to embodiments of the present invention suppresses the formation of oxide films between the first metal oxide films and the substrate and the third metal oxide films and the first metal layer. Thus, according to some embodiments of the present invention, there are no oxide films separating a substrate 200 from a first metal layer 260 or separating the metal layers such as a first metal layer 260 and a second metal layer 290.

According to other embodiments of the present invention, a capacitor can be formed. An example of the formation of a capacitor according to embodiments of the present invention is illustrated in FIGS. 4A–4G.

Figure 4A:
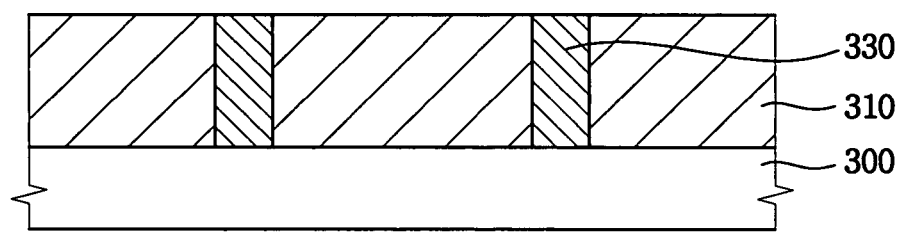
FIGS. 4A–4G are cross-sectional views of a capacitor formed according to embodiments of the present invention.

FIG. 4A illustrates a cross-sectional view of contact plugs 330 formed through a first insulation film 310 to a substrate 300. The contact plugs 330 are formed by the formation of a first insulation film 310 over a substrate 300. The substrate 300 is divided into a field region (not shown) and an active region (not shown). Contact regions such as transistors (not shown) or other conductive structures may be formed on the substrate 300. The first insulation film 310 is etched to form openings in the first insulation film 310, exposing the contact regions on the substrate 300. A conductive material is deposited over the etched first insulation film 310 as known in the art to deposit conductive material in the openings. The conductive material formed over the first insulation film 310 is etched by a chemical mechanical process, or other process as known in the art, to expose the first insulation layer 310. The conductive material remaining in the openings form the contact plugs 330 through the first insulation material 310.

Figure 4B:
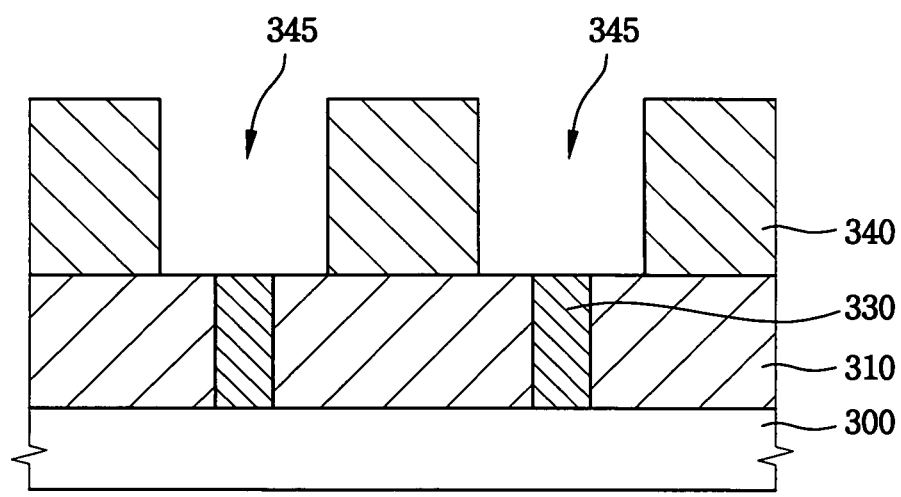

A second insulation film 340 is deposited over the first insulation film 310 and the contact plugs 330 as illustrated in FIG. 4B. The second insulation film 340 is then etched to form second openings 345 through the second insulation film 340, which expose the contact plugs 330. The second openings 345 can be wider than the contact plugs. For example, a photoresist film is formed over the second insulation film 340 and is exposed and developed to form a mask pattern on the second insulation film 340. The second insulation film 340 is then partially etched using the mask pattern as an etching mask to form the second openings 345 that can be wider than the contact plugs 330 and that expose the contact plugs 330.

Figure 4C:
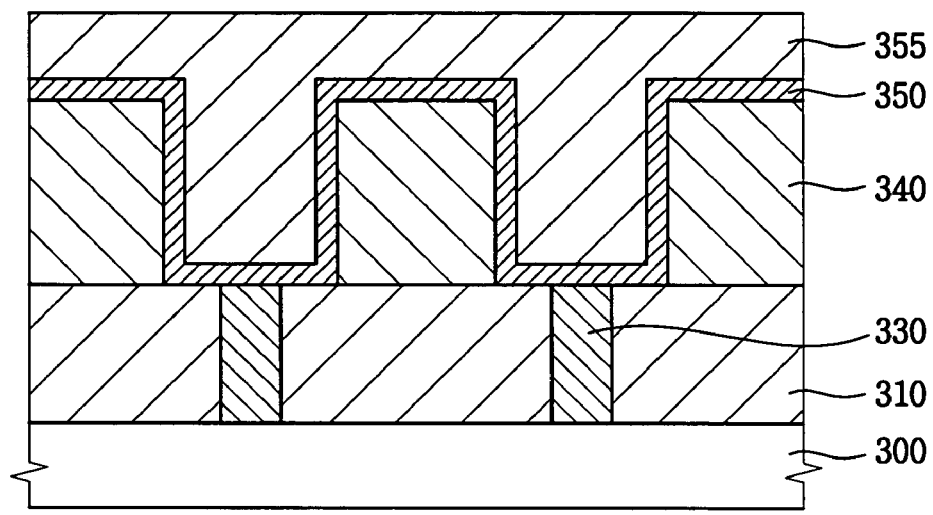

As illustrated in FIG. 4C, a conductive film 350 is formed on the second insulation film 340 and on sidewalls and bottom faces of the second openings 345. The conductive film 350 can include a material such as polysilicon, metal, metal oxide, metal nitride, or metal oxynitride. A third insulation film 355 is then formed on the conductive film 350 to fill the second openings 345.

Figure 4D:
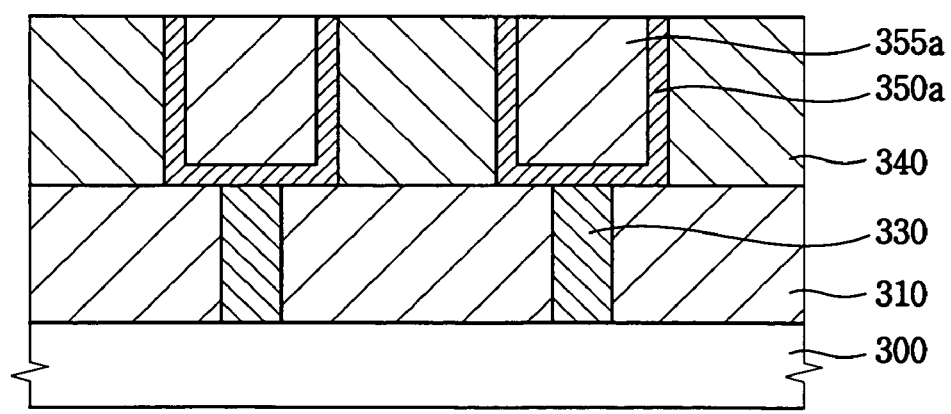

Portions of the third insulation film 355 and the conductive film 350 are removed from the structure by a chemical mechanical polishing process, or other known process, until the second insulation film 340 is exposed as illustrated in FIG. 4D. The remaining conductive film 350 forms bottom electrodes 350a filled with insulation film patterns 355a.

Figure 4E:
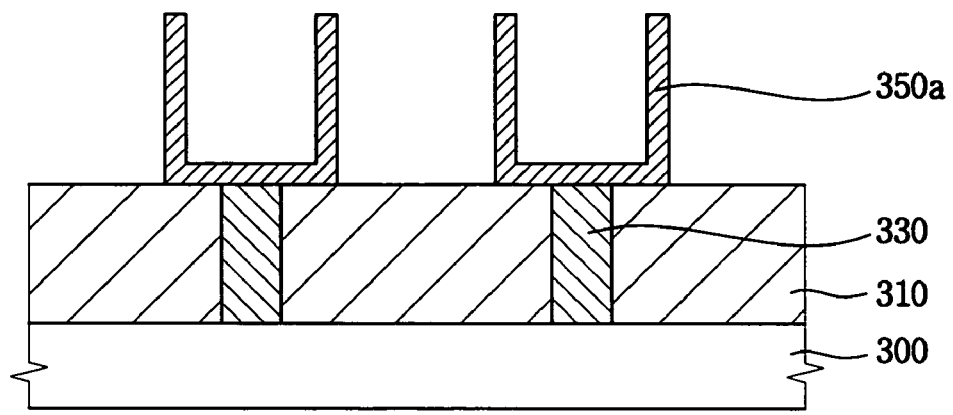

The second insulation film 340 and the inner insulation film patterns 355a are removed from the structure to expose the bottom electrodes 350a formed over the contact plugs 330 as illustrated in FIG. 4E.

A buffer layer (not shown) may be formed on the bottom electrodes 350a to prevent reaction or diffusion between the bottom electrodes 350a and a dielectric film subsequently formed on the bottom electrodes 350a. For example, a buffer layer can be formed on a bottom electrode 350a formed of polysilicon, silicon oxide, silicon nitride, or silicon oxynitride by a rapid thermal nitration (RTN) process or a rapid thermal oxidation (RTO) process. A buffer layer formed by an RTN process is performed at a temperature between about 500° C. to about 900° C. in a nitrogen ($N_2$) or an ammonia ($NH_3$) atmosphere. A buffer layer formed by an RTO process is performed at a temperature between about 500° C. and about 900° C. in an oxygen ($O_2$) or a dinitrogen monoxide ($N_2O$) atmosphere. The activation energy for forming the buffer layer can be lowered by providing a light energy such as a plasma or an ultra violet light on the reactant.

The formation of a buffer layer can reduce the deterioration of a dielectric film on the bottom electrodes 350a. In addition, a buffer layer can decrease leakage current by dissipating an electric field directly applied to a dielectric film formed on the bottom electrodes 350a.

Figure 4F:
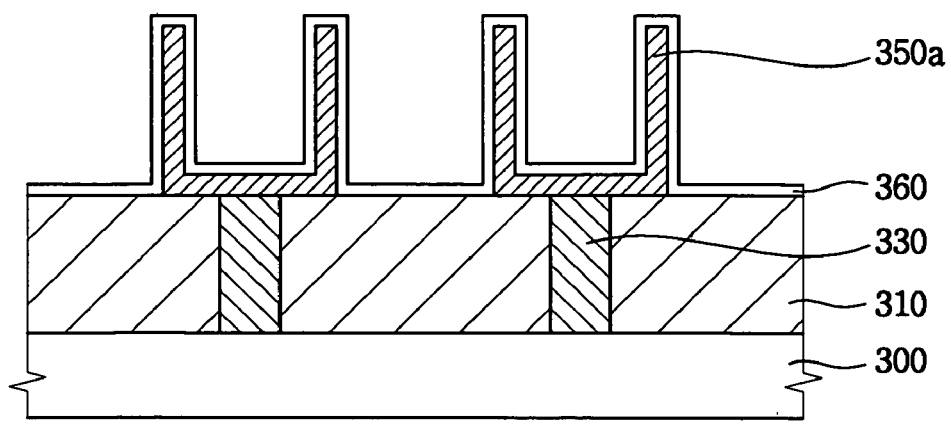

According to embodiments of the present invention, a dielectric film is formed on the structure illustrated in FIG. 4E. To form a dielectric film according to embodiments of the present invention, the structure illustrated in 4E is loaded into an atomic-layer deposition chamber (not shown). A first metal precursor introduced into the deposition chamber forms a first absorption film over the bottom electrodes 350a and the exposed first insulation layer 310. Portions of the first metal precursor that are not chemisorbed to form the first absorption layer are purged from the deposition chamber. An inert gas can be used to purge the unused first metal precursor. A first oxidizing agent is then introduced into the deposition chamber to oxidize the first absorption layer. Excess first oxidizing agent is purged from the deposition chamber, leaving a first metal oxide film formed over the bottom electrodes 350a and the exposed first insulation layer 310. A second metal precursor is introduced into the deposition chamber to form a second absorption film over the first metal oxide film. Portions of the second metal precursor that are not chemisorbed on the first metal oxide film to form the second absorption film are purged from the deposition chamber. A second oxidizing agent is introduced to the deposition chamber to oxidize the second absorption film, forming a second metal oxide film over the first metal oxide film. The combination of the first metal oxide film and the second metal oxide film form a metal layer that is a dielectric layer 360 as illustrated in FIG. 4F.

According to other embodiments of the present invention, the dielectric layer 360 includes multiple metal layers formed according to embodiments of the present invention. For instance, in some embodiments a dielectric layer 360 having multiple metal layers is formed by methods similar to those described with respect to FIGS. 3A–3F.

The dielectric layers 360 formed according to embodiments of the present invention are formed in an atomic-layer deposition chamber set at a predetermined temperature between about 100° C. and about 700° C. In some embodiments, the temperature in the deposition chamber may be between about 250° C. and 450° C.

The first absorption films are oxidized to form the first metal oxide film using water vapor as the first oxidizing agent. The use of water vapor as the first oxidizing agent inhibits the formation of an oxide layer between the first metal oxide film and the substrate on which it is deposited, for example the bottom electrode 350a or a buffer layer thereon. The second absorption films are oxidized using ozone as an oxidizing agent. The use of ozone as an oxidizing agent results in a faster oxidation of the second absorption films than the first absorption films. Inert purge gases are used to remove the first and second metal precursors and the oxidizing agents from the deposition chamber.

The dielectric layers 360 formed according to embodiments of the present invention are multi-layered structures that can include different metal oxides, such as, but not limited to, tantalum oxides, hafnium oxides, titanium oxides, aluminum oxides, or lanthanum oxides. In some embodiments of the present invention the dielectric layers 360 have a high dielectric constant.

Figure 4G:
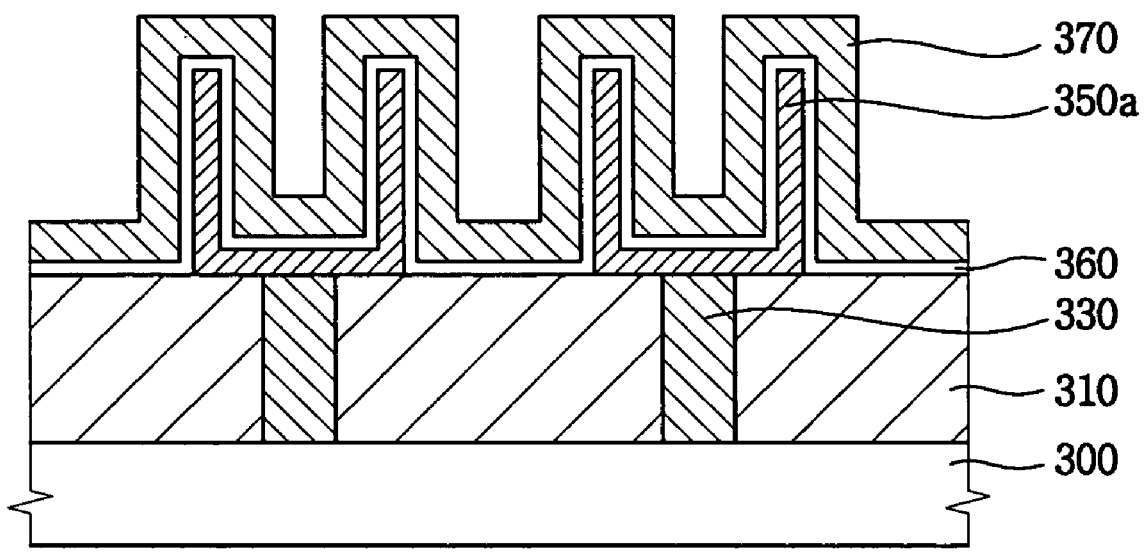

After a dielectric layer 360 is formed according to embodiments of the present invention, it can be thermally treated under an oxygen atmosphere. A plasma or an ultra violet ray can be applied during the thermal treatment as an additional source of energy. In addition, argon (Ar), nitrogen ($N_2$), hydrogen ($H_2$), helium (He), oxygen ($O_2$), ozone ($O_3$), or ammonia ($NH_3$) may be provided to the dielectric layer 360. The thermal treatment improves the density of the dielectric layer 360 and effectively prevents the generation of leakage current from the dielectric layer 360.

illustrated in FIG. 4G, a top electrode 370 is formed on the dielectric layer 360. The top electrode 370 is formed from a material such as polysilicon, metal, metal oxide, metal nitride, or metal oxynitride. The material used to form the top electrode may be selected to prevent the deterioration of the dielectric layer 360. For example, the top electrode 370 can be formed from titanium nitride (TiNx). Deterioration of the dielectric layer 360 is prevented by the titanium nitride because the titanium nitride will not react with the dielectric layer 360.

Multi-layered structures formed according to embodiments of the present improved characteristics which result from the methods of forming the multi-layered structures. For instance, the multi-layered structures exhibit excellent electrical characteristics and lack oxide layers at the interfaces between a substrate and the metal oxide layers. In addition, oxide layers do not form between the metal oxide layers due to the methods by which the multi-layered structures are formed. Furthermore, the ability to form the multi-layered structures in a single deposition chamber at a predetermined temperature according to embodiments of the present invention improves the efficiency of the production process and reduces cost associate with the production of multi-layered structures.

Having thus described certain embodiments of the present invention, it is to be understood that the invention defined by the appended claims is not to be limited by particular detail set forth in the above description as many apparent variations thereof are possible without departing from the spirit or scope thereof as hereinafter claimed.

What is claimed is:

1. A method for forming a multi-layered structure, comprising:
loading a substrate into a deposition chamber;
introducing a first metal precursor into the deposition chamber, wherein at least a portion of the first metal precursor forms a first absorption film on the substrate;
purging the deposition chamber of the first metal precursor;
introducing a first oxidizing agent including water vapor providing low oxidation of the substrate into the deposition chamber, wherein at least a portion of the first oxidizing agent oxidizes the first absorption film forming a first metal oxide film, and wherein formation of an oxide film at an interface between the substrate and the first metal oxide film is prevented;
purging the deposition chamber of the first oxidizing agent;
introducing a second metal precursor into the deposition chamber, wherein at least a portion of the second metal precursor forms a second absorption film on the first metal oxide film;
purging the deposition chamber of the second metal precursor; and
introducing a second oxidizing agent including ozone providing high oxidation of the substrate relative to the low oxidation provided by the first oxidizing agent into the deposition chamber, wherein at least a portion of the second oxidizing agent oxidizes the second absorption film forming a second metal oxide film and wherein the second metal oxide film is formed faster than the first metal oxide film.

2. The method of claim 1, wherein a temperature within the deposition chamber is from about 100° C. to about 700° C.

3. The method of claim 1, wherein a temperature within the deposition chamber is from about 250° C to about 450° C.

4. The method of claim 1, wherein the first metal oxide film comprises an oxide film selected from the group consisting of tantalum oxide, hafnium oxide, titanium oxide, aluminum oxide, and lanthanum oxide.

5. The method of claim 1, wherein the second metal oxide film comprises an oxide film selected from the group consisting of tantalum oxide, hafnium oxide, titanium oxide, aluminum oxide, and lanthanum oxide.

6. The method of claim 1, further comprising purging the deposition chamber of the second oxidizing agent.

7. The method of claim 1, wherein the first metal oxide film and second metal oxide film comprise a first metal layer.

8. The method of claim 1, further comprising:
purging the deposition chamber of the second oxidizing agent;
introducing a third metal precursor into the deposition chamber,
wherein at least a portion of the third metal precursor forms a third absorption film on the first metal layer;
purging the deposition chamber of the third metal precursor;
introducing a first oxidizing agent into the deposition chamber,
wherein at least a portion of the first oxidizing agent oxidizes the third absorption film forming a third metal oxide film;
purging the deposition chamber of the first oxidizing agent;
introducing a fourth metal precursor into the deposition chamber,
wherein at least a portion of the fourth metal precursor forms a fourth absorption film on the third metal oxide film;
purging the deposition chamber of the fourth metal precursor;
introducing a second oxidizing agent into the deposition chamber,
wherein at least a portion of the second oxidizing agent oxidizes the fourth absorption film forming a fourth metal oxide film; and
wherein the third and fourth metal oxide film form a second metal layer.

9. A method for forming a multi-layered structure, comprising:
(i) loading a substrate into a deposition chamber;
(ii) introducing a first metal precursor into the deposition chamber, wherein at least a portion of the first metal precursor forms a first absorption film on the substrate;
(iii) purging the deposition chamber of the first metal precursor;
(iv) introducing a first oxidizing agent including water vapor providing low oxidation of the substrate into the deposition chamber, wherein at least a portion of the first oxidizing agent oxidizes the first absorption film forming a first metal oxide film, and wherein formation of an oxide film at an interface between the substrate and the first metal oxide film is prevented;
(v) purging the deposition chamber of the first oxidizing agent;
(vi) introducing a second metal precursor including ozone providing high oxidation of the substrate relative to the low oxidation provided by the first oxidizing-agent into the deposition chamber, wherein at least a portion of the second metal precursor forms a second absorption film on the first metal oxide film, and wherein the second metal oxide film is formed faster than the first metal oxide film;
(vii) purging the deposition chamber of the second metal precursor; and
(viii) introducing a second oxidizing agent into the deposition chamber, wherein at least a portion of the second oxidizing agent oxidizes the second absorption film forming a second metal oxide film;
(ix) purging the deposition chamber of the second oxidizing agent;
(x) introducing a third metal precursor into the deposition chamber, wherein at least a portion of the the third metal precursor forms a third absorption film on the first metal layer;
(xi) purging the deposition chamber of the third metal precursor;
(xii) introducing a first oxidizing agent into the deposition chamber, wherein at least a portion of the first oxidizing agent oxidizes the third absorption film forming a third metal oxide film;
(xiii) purging the deposition chamber of the first oxidizing agent;
(xiv) introducing a fourth metal precursor into the deposition chamber, wherein at least a portion of the fourth metal precursor forms a fourth absorption film on the third metal oxide film;
(xv) purging the deposition chamber of the fourth metal precursor;
(xvi) introducing a second oxidizing agent into the deposition chamber, wherein at least a portion of the second oxidizing agent oxidizes the fourth absorption film forming a fourth metal oxide film; and wherein the third and fourth metal oxide film form an additional metal layer.

10. The method of claim 9, further comprising repeating steps (ix) through (xvi) to form additional metal layers.

11. The method of claim 9, wherein a temperature within the deposition chamber is from about 100° C. to about 700° C.

12. The method of claim 9, wherein a temperature within the deposition chamber is from about 250° C. to about 450° C.

13. The method of claim 9, wherein each of the metal oxide films comprises an oxide film selected from the group consisting of tantalum oxide, hafnium oxide, titanium oxide, aluminum oxide, and lanthanum oxide.

14. A method of forming a capacitor, comprising:
providing a substrate having a bottom electrode in a deposition chamber;
introducing a first metal precursor into the deposition chamber, wherein at least a portion of the first metal precursor forms a first absorption film on the bottom electrode;
purging the deposition chamber of the first metal precursor;
introducing a first oxidizing agent including water vapor providing low oxidation of the substrate into the deposition chamber, wherein at least a portion of the first oxidizing agent oxidizes the first absorption film forming a first metal oxide film and prevents the formation of an oxide film at an interface between the bottom electrode and the first metal oxide film;
purging the deposition chamber of the first oxidizing agent;
introducing a second metal precursor into the deposition chamber, wherein at least a portion of the second metal precursor forms a second absorption film on the first metal oxide film;
purging the deposition chamber of the second metal precursor;
introducing a second oxidizing agent including ozone providing high oxidation of the substrate relative to the low oxidation provided by the first oxidizing agent into the deposition chamber, wherein at least a portion of the second oxidizing agent oxidizes the second absorption film forming a second metal oxide film, and wherein the second metal oxide film is formed faster than the first metal oxide film;
purging the deposition chamber of the second oxidizing agent; and
forming a top electrode on the second metal oxide film.

15. The method of claim 14, wherein a temperature within the deposition chamber is from about 100 ° C. to about 700° C.

16. The method of claim 14, wherein a temperature within the deposition chamber is from about 250° C. to about 450° C.

17. The method of claim 14, further comprising forming a buffer layer on the bottom electrode.

18. The method of claim 17, wherein forming a buffer layer on the bottom electrode comprises nitrifying the bottom electrode.

19. The method of claim 17, wherein forming a buffer layer on the bottom electrode comprises oxidizing the bottom electrode.

20. The method of claim 14, further comprising:
thermally treating the first metal oxide film; and
thermally treating the second metal oxide film.

21. The method of claim 20, further comprising exposing the first metal oxide film to a plasma or an ultra violet ray during the thermal treatment.

22. The method of claim 20, further comprising exposing the second metal oxide film to a plasma or an ultra violet ray during the thermal treatment.

23. The method of claim 20, further comprising supplying a gas selected from the group consisting of argon, nitrogen, hydrogen, helium, oxygen, ozone, and ammonia during the thermal treatment.

* * * * *